(12) United States Patent
Tang

(10) Patent No.: US 11,233,216 B2
(45) Date of Patent: Jan. 25, 2022

(54) DISPLAY WITH ENLARGED CONNECTION AREAS OF CATHODES AND PREPARATION METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Jia Tang, Shenzhen (CN)

(*) Notice: Subject to any disclaimer, the term of this patent is extended or adjusted under 35 U.S.C. 154(b) by 233 days.

(21) Appl. No.: 16/616,978

(22) PCT Filed: Jul. 8, 2019

(86) PCT No.: PCT/CN2019/095054
§ 371 (c)(1),
(2) Date: Nov. 26, 2019

(87) PCT Pub. No.: WO2020/228117
PCT Pub. Date: Nov. 19, 2020

(65) Prior Publication Data
US 2021/0336187 A1    Oct. 28, 2021

(30) Foreign Application Priority Data
May 10, 2019   (CN) .......................... 201910388679.9

(51) Int. Cl.
*H01L 29/08*    (2006.01)
*H01L 51/52*    (2006.01)
*H01L 51/56*    (2006.01)
*H01L 27/32*    (2006.01)

(52) U.S. Cl.
CPC .......... *H01L 51/5228* (2013.01); *H01L 51/56* (2013.01); *H01L 27/3246* (2013.01); *H01L 2227/323* (2013.01)

(58) Field of Classification Search
CPC . H01L 51/5228; H01L 51/56; H01L 27/3246; H01L 2227/323
See application file for complete search history.

(56) References Cited

U.S. PATENT DOCUMENTS

2014/0264315 A1*   9/2014  Ono ..................... H01L 51/5228
                                                            257/40
2015/0097171 A1*   4/2015  Kim ..................... H01L 51/5228
                                                            257/40

* cited by examiner

*Primary Examiner* — Phuc T Dang

(57) ABSTRACT

The present invention provides a display including: a thin film transistor substrate including a plurality of thin film transistors; a planarization layer; a plurality of anodes and a plurality of auxiliary source traces; a pixel definition layer having a plurality of first openings respectively corresponding to and exposing a plurality of auxiliary source traces and a plurality of second openings respectively corresponding to and exposing a plurality of anodes; a plurality of electrical conductors filled in the plurality of first openings and on a portion of the pixel definition layer around the plurality of first openings, wherein the plurality of electrical conductors have a plurality of protruding portions higher than the pixel definition layer; an electroluminescent layer; and a plurality of cathodes electrically connected to sidewalls of the plurality of electrical conductors respectively.

13 Claims, 5 Drawing Sheets

| | |
|---|---|
| providing a thin film transistor substrate, wherein the thin film transistor substrate comprises a plurality of thin film transistors; | S10 |
| forming a planarization layer on the thin film transistor substrate; | S20 |
| forming a plurality of anodes and a plurality of auxiliary source traces on a portion of the planarization layer, wherein the plurality of anodes are electrically connected to the plurality of thin film transistors through the planarization layer; | S30 |
| forming a pixel definition layer on the plurality of anodes, the plurality of auxiliary source traces, and the planarization layer not covered by the plurality of anodes and the plurality of auxiliary source traces, wherein the pixel definition layer has a plurality of first openings respectively corresponding to and exposing the plurality of auxiliary source traces, and the pixel definition layer has a plurality of second openings respectively corresponding to and exposing the plurality of anodes; | S40 |
| forming a plurality of electrical conductors filled in the plurality of first openings and on a portion of the pixel definition layer around the plurality of first openings, wherein the plurality of electrical conductors have a plurality of protruding portions higher than the pixel definition layer; | S50 |
| forming an electroluminescent layer on an upper surface of the electrical conductor and a sidewall and a bottom of the plurality of second openings; and | S60 |
| forming a plurality of cathodes on the electroluminescent layer and electrically connected to sidewalls of the plurality of electrical conductors respectively. | S70 |

FIG. 1

DISPLAY WITH ENLARGED CONNECTION AREAS OF CATHODES AND PREPARATION METHOD THEREOF

BACKGROUND OF INVENTION

Field of Invention

The present invention relates to a display, and more particularly to a large-sized high-resolution display and a method of preparing the same.

Description of Prior Art

At present, a small-sized active-matrix organic light-emitting diode (AMOLED) generally adopts a red-green-blue organic light-emitting diode (RGBOLED) and a fine metal mask (FMM) process, which has a non-obvious phenomenon of IR drop. A large-sized AMOLED panel adopts a white organic light-emitting diode with a color filter (WOLED+CF) process, which needs a cathode having high transparency for top emission and high resolution, so the film thickness must be very thin, which leads to a large impedance. Based on constraints of the current material and design, the IR drop problem occurs between a center of a display area and its peripheral during operation. For a target of mass production, especially G8.5 or above, a design of introduction of an auxiliary electrode is required to provide additional assistance to areas of large IP drop, so that display of the entire screen is uniform and stable during operation. At present, a main solution is to fabricate the auxiliary electrode into an inverted trapezoidal spacer column, which is high in cost and complicated in process, and a backboard of an electroluminescence/ink-jet printing organic light-emitting diode (EL/IJP-OLED) is more difficult to implement, additionally requiring a contact via, which is unfavorable to the design of a circuit and the backboard of high resolution (pixels per inch, PPI).

In order to solve the above problems of the conventional display, there is an urgent need to develop a large-sized and high-resolution display.

SUMMARY OF INVENTION

In view of the above, the present invention provides a display that utilizes a design of an auxiliary electrode of an organic light-emitting diode (OLED) panel made by large-scale evaporation coating or printing, wherein by changing the backboard design, during the anode process, the auxiliary source trace is prepared in advance, such that the trace is located at a bottom of a pixel definition layer (PDL). During the PDL layer process, an opening is formed along a lengthwise direction of a sub-pixel, and electrical conductors having protruding portions are formed to connect with auxiliary source traces. A distance of the electrical conductors having the protruding portions higher than the PDL is determined according to thicknesses of an electroluminescence (EL) layer and a cathode, and sidewalls of the electrical conductors having the protruding portions are designed to be steep, so that material of the electroluminescent layer is naturally broken between a top and a bottom of the electrical conductors. As such, the cathode material can be evaporated at the broken positions to achieve electrical connections to the sidewalls of the electrical conductors. Since the electrical conductors along a long axis of the sub-pixel is large, connection areas of the cathodes and the electrical conductors become two-dimensional, and are greatly enlarged, thereby improving the poor performance of a conventional point connection to auxiliary electrode. In addition, the auxiliary electrode design proposed by the present invention occupies no extra space, that is, the problem of IR drop of the active-matrix organic light-emitting diode (AMOLED) panel is solved while increasing the design space of the light-emitting area during illuminating the top backboard.

Accordingly, an embodiment of the present invention provides a display including: a thin film transistor substrate including a plurality of thin film transistors; a planarization layer disposed on the thin film transistor substrate; a plurality of anodes and a plurality of auxiliary source traces disposed on the planarization layer, wherein the plurality of anodes are electrically connected to the plurality of thin film transistors through the planarization layer; a pixel definition layer disposed on the plurality of anodes, the plurality of auxiliary source traces, and the planarization layer not covered by the plurality of anodes and the plurality of auxiliary source traces, wherein the pixel definition layer has a plurality of first openings respectively corresponding to and exposing the plurality of auxiliary source traces, and the pixel definition layer has a plurality of second openings respectively corresponding to and exposing the plurality of anodes; a plurality of electrical conductors filled in the plurality of first openings and on a portion of the pixel definition layer around the plurality of first openings, wherein the plurality of electrical conductors have a plurality of protruding portions higher than the pixel definition layer; an electroluminescent layer covering an upper surface of the electrical conductors and a sidewall and a bottom of the plurality of second openings; and a plurality of cathodes covering the electroluminescent layer and electrically connected to sidewalls of the plurality of electrical conductors respectively.

According to another embodiment of the present invention, the present invention also provides a method of preparing a display, including:

S10, providing a thin film transistor substrate, wherein the thin film transistor substrate includes a plurality of thin film transistors;

S20, forming a planarization layer on the thin film transistor substrate;

S30, forming a plurality of anodes and a plurality of auxiliary source traces on a portion of the planarization layer, wherein the plurality of anodes are electrically connected to the plurality of thin film transistors through the planarization layer;

S40, forming a pixel definition layer on the plurality of anodes, the plurality of auxiliary source traces, and the planarization layer not covered by the plurality of anodes and the plurality of auxiliary source traces, wherein the pixel definition layer has a plurality of first openings respectively corresponding to and exposing the plurality of auxiliary source traces, and the pixel definition layer has a plurality of second openings respectively corresponding to and exposing the plurality of anodes;

S50, forming a plurality of electrical conductors filled in the plurality of first openings and on a portion of the pixel definition layer around the plurality of first openings, wherein the plurality of electrical conductors have a plurality of protruding portions higher than the pixel definition layer;

S60, forming an electroluminescent layer on an upper surface of the electrical conductor and a sidewall and a bottom of the plurality of second openings; and S70, forming a plurality of cathodes on the electroluminescent layer and electrically connected to sidewalls of the plurality of electrical conductors respectively.

In an embodiment of the invention, in the step S60, forming the electroluminescent layer includes evaporation coating, and material of the electroluminescent layer is naturally broken at sidewalls of the protruding portions to form broken positions which expose the sidewalls of the protruding portions.

In an embodiment of the invention, in the step S70, forming the plurality of cathodes includes: performing evaporation coating at a specific angle according to the included angle to achieve electrical connections of the plurality of cathodes to the sidewalls of the protruding portions at the broken positions.

In an embodiment of the invention, the plurality of electrical conductors include a metallic or organic electrically conductive material, and the electroluminescent layer includes an organic material.

In an embodiment of the invention, the plurality of electrical conductors are higher than upper surfaces of the plurality of cathodes.

In an embodiment of the invention, an included angle between a sidewall of each of the plurality of protruding portions and an upper surface of the pixel definition layer is less than or equal to 90 degrees.

In an embodiment of the invention, each of the plurality of protruding portions has a rectangular shape, an inverted trapezoidal shape, or an irregular shape wide at top and narrow at bottom.

In an embodiment of the invention, the sidewalls of the plurality of protruding portions are flat or irregularly shaped surfaces.

In an embodiment of the invention, the electroluminescent layer is configured to emit white light.

The present invention provides a display that utilizes a design of an auxiliary electrode of an organic light-emitting diode (OLED) panel made by large-scale evaporation coating or printing, wherein by changing the backboard design, during the anode process, the auxiliary source trace is prepared in advance such that the trace is located at a bottom of a pixel definition layer (PDL). During the PDL layer process, an opening is formed along a lengthwise direction of a sub-pixel, and electrical conductors having protruding portions are formed to connect with auxiliary source traces. A distance of the electrical conductors having the protruding portions higher than the PDL is determined according to thicknesses of an electroluminescence (EL) layer and a cathode, and sidewalls of the electrical conductors having the protruding portions are designed to be steep, so that material of the electroluminescent layer is naturally broken between a top and a bottom of the electrical conductors. As such, the cathode material can be evaporated at the broken positions to achieve electrical connections to the sidewalls of the electrical conductors. Since the electrical conductors along a long axis of the sub-pixel is large, connection areas of the cathodes and the electrical conductors become two-dimensional, and are greatly enlarged, thereby improving the poor performance of a conventional point connection to auxiliary electrode. In addition, the auxiliary electrode design proposed by the present invention occupies no extra space, that is, the problem of IR drop of the active-matrix organic light-emitting diode (AMOLED) panel is solved while increasing the design space of the light-emitting area during illuminating the top backboard.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

FIG. 1 is a flow chart of a method of preparing a display according to an embodiment of the present invention.

DETAILED DESCRIPTION OF PREFERRED EMBODIMENTS

Figure 2A:
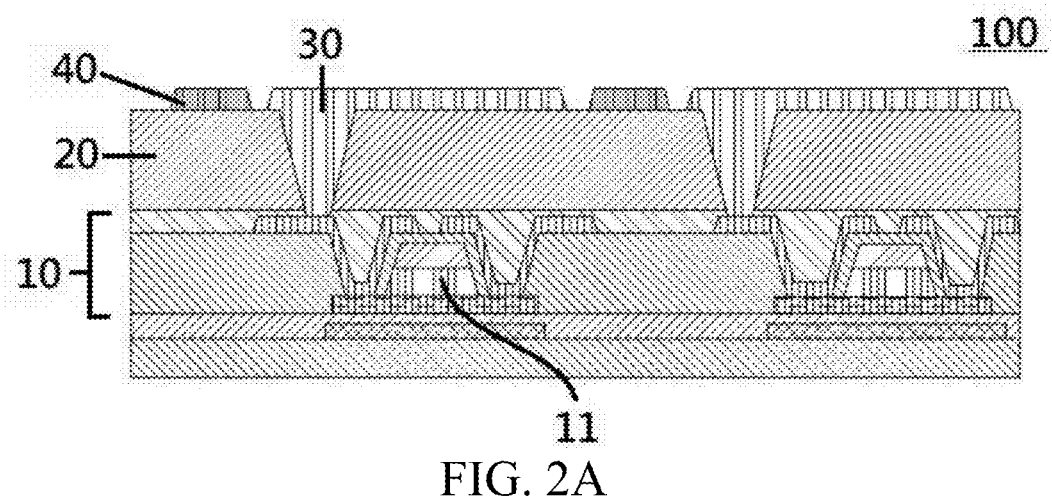
FIGS. 2A to 2E are schematic diagrams showing structures of a display in different steps according to an embodiment of the present invention.

In order to make the above description of the present invention more comprehensible, the preferred embodiments are described below in detail with reference to the accompanying drawings.

The following description of the various embodiments is provided to illustrate the specific embodiments of the invention. Directional terms mentioned in the present invention, such as "vertical", "horizontal", "upper", "bottom", "pre", "post", "left", "right", "inside", "outside", "side", etc., only refer to the direction of the additional drawing. Therefore, the directional terminology used is for the purpose of illustration and understanding of the invention. In the figures, structurally similar elements are denoted by the same reference numerals.

The present invention provides a display that utilizes a design of an auxiliary electrode of an organic light-emitting diode (OLED) panel made by large-scale evaporation coating or printing, wherein by changing the backboard design, during the anode process, the auxiliary source trace is prepared in advance such that the trace is located at a bottom of a pixel definition layer (PDL). During the PDL layer process, an opening is formed along a lengthwise direction of a sub-pixel, and electrical conductors having protruding portions are formed to connect with auxiliary source traces. A distance of the electrical conductors having the protruding portions higher than the PDL is determined according to thicknesses of an electroluminescence (EL) layer and a cathode, and sidewalls of the electrical conductors having the protruding portions are designed to be steep, so that material of the electroluminescent layer is naturally broken between a top and a bottom of the electrical conductors. As such, the cathode material can be evaporated at the broken positions to achieve electrical connections to the sidewalls of the electrical conductors. Since the electrical conductors along a long axis of the sub-pixel is large, connection areas of the cathodes and the electrical conductors become two-dimensional, and are greatly enlarged, thereby improving the poor performance of a conventional point connection to auxiliary electrode. In addition, the auxiliary electrode design proposed by the present invention occupies no extra space, that is, the problem of IP drop of the active-matrix organic light-emitting diode (AMOLED) panel is solved while increasing the design space of the light-emitting area during illuminating the top backboard.

Figure 2B:
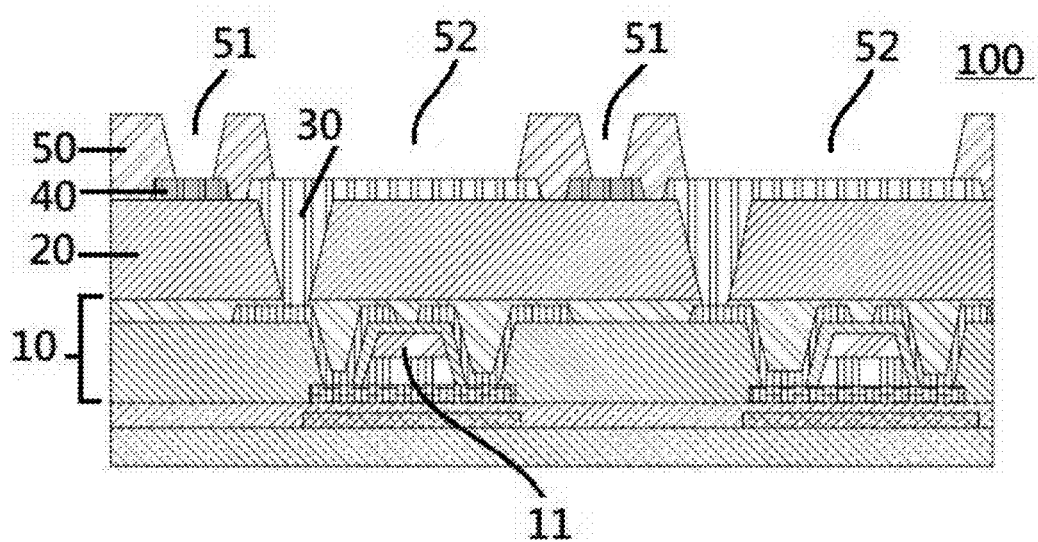
Figure 2C:
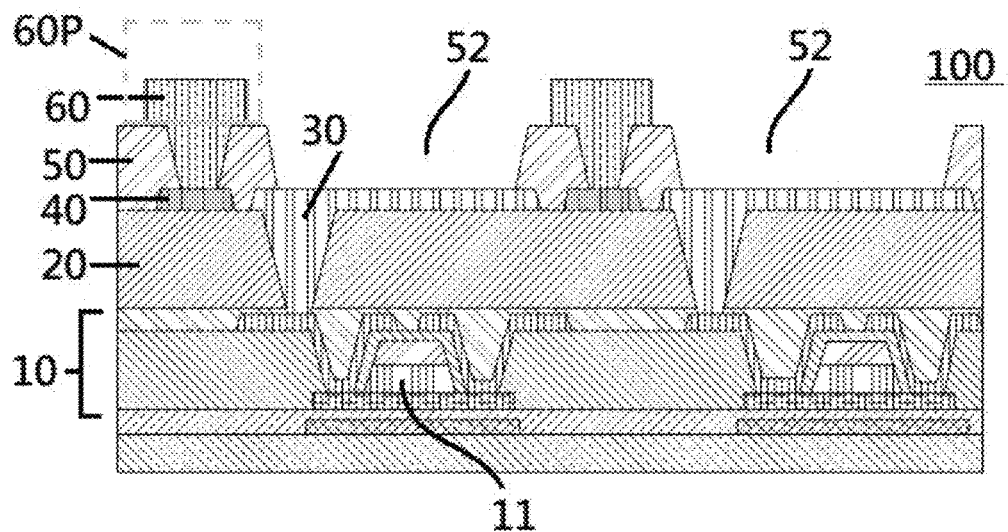
Figure 2D:
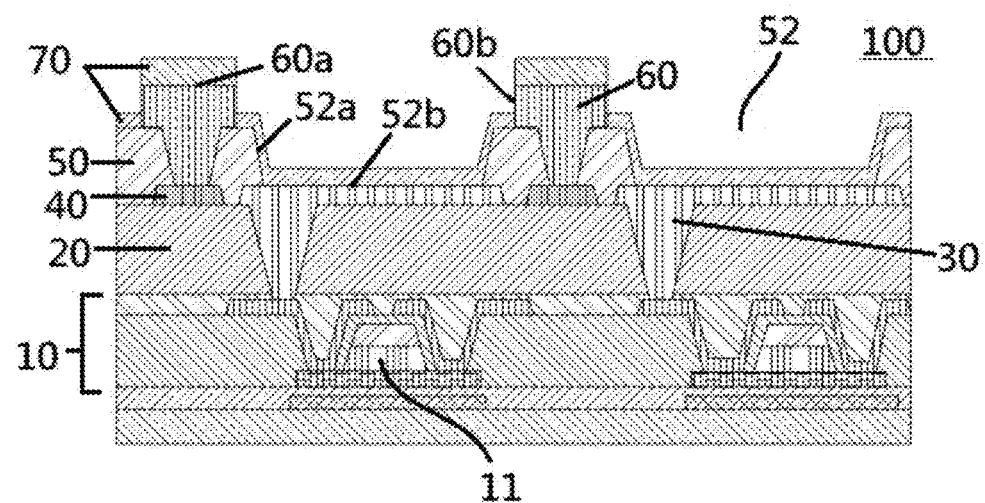
Figure 2E:
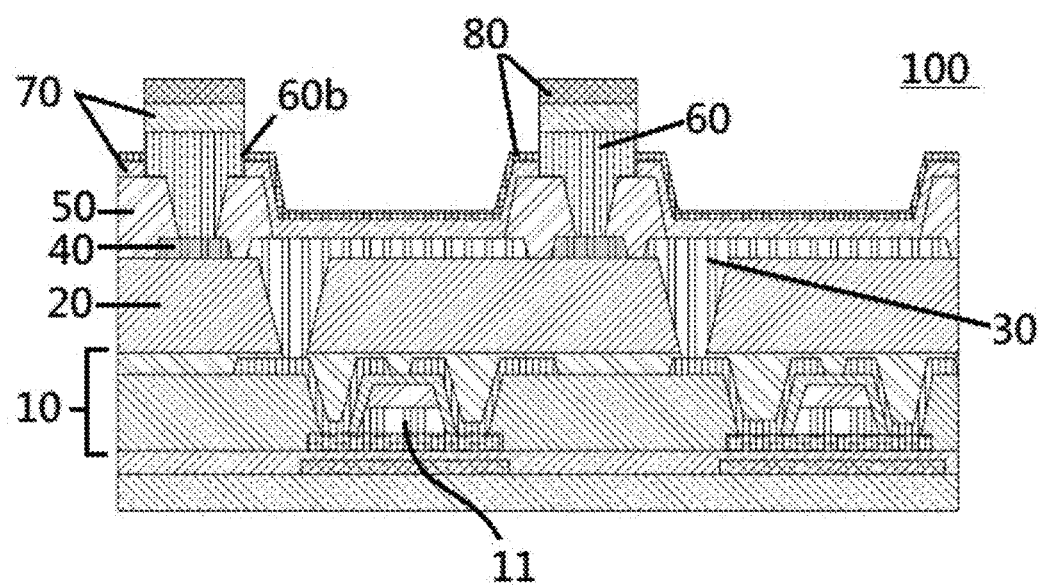

FIG. 1 is a flow chart of a method of preparing a display according to an embodiment of the present invention. FIGS. 2A to 2E are schematic diagrams showing structures of a display in different steps according to an embodiment of the present invention. As shown in FIG. 1 and FIG. 2A to FIG. 2E, in particular, according to another embodiment of the present invention, the present invention provides a method of preparing the display 100, including:

S10, providing a thin film transistor substrate 10, wherein the thin film transistor substrate 10 includes a plurality of thin film transistors 11, as shown in FIG. 2A;

S20, forming a planarization layer 20 on the thin film transistor substrate 10, as shown in FIG. 2A;

S30, forming a plurality of anodes 30 and a plurality of auxiliary source traces 40 on a portion of the planarization layer 20, wherein the plurality of anodes 30 are electrically connected to the plurality of thin film transistors 10 through the planarization layer 20, as shown in FIG. 2A;

S40, forming a pixel definition layer 50 on the plurality of anodes 30, the plurality of auxiliary source traces 40, and the planarization layer not covered by the plurality of anodes 30 and the plurality of auxiliary source traces 40, wherein the pixel definition layer 50 has a plurality of first openings 51 respectively corresponding to and exposing the plurality of auxiliary source traces 40, and the pixel definition layer 50 has a plurality of second openings 52 respectively corresponding to and exposing the plurality of anodes 30, as shown in FIG. 2B;

S50, forming a plurality of electrical conductors 60 filled in the plurality of first openings 51 and on a portion of the pixel definition layer 50 around the plurality of first openings 51, wherein the plurality of electrical conductors 60 have a plurality of protruding portions 60P higher than the pixel definition layer 50, as shown in FIG. 2C;

S60, forming an electroluminescent layer 70 on an upper surface 60a of the electrical conductor and a sidewall 52a and a bottom 52b of the plurality of second openings 52, as shown in FIG. 2D; and S70, forming a plurality of cathodes on the electroluminescent layer 70 and electrically connected to sidewalls of the plurality of electrical conductors 60 respectively, as shown in FIG. 2E.

In the above embodiment, when the pixel defining layer 50 is formed, an opening is specifically formed along a lengthwise direction of a sub-pixel (not shown), and electrical conductors 60 having protruding portions 60P are formed to connect with auxiliary source traces 40. The electrical conductors having the protruding portions have great heights and steep sidewalls, so that material of the electroluminescent layer 70 (generally within 4500 Å) is naturally broken between a top and a bottom of the electrical conductors 60. As such, the material of the cathodes 80 can be evaporated at the broken positions to achieve electrical connections to the sidewalls 60b of the electrical conductors 60. Since the electrical conductors 60 along a long axis of the sub-pixel is large, connection areas of the cathodes 80 and the electrical conductors 60 become two-dimensional, and are greatly enlarged.

In this way, the auxiliary electrode designed by the present invention occupies no extra space, that is, the problem of IR drop of the active-matrix organic light-emitting diode (AMOLED) panel is solved while increasing the design space of the light-emitting area during illuminating the top backboard.

As shown in FIGS. 2C and 2D, in an embodiment of the present invention, in the step S60, forming the electroluminescent layer 70 includes evaporation coating, and material of the electroluminescent layer 70 is naturally broken at sidewalls 60b of the protruding portions 60P to form broken positions which expose the sidewalls 60b of the protruding portions 60P.

As shown in FIG. 2E, in an embodiment of the present invention, in the step S70, forming the plurality of cathodes 80 includes: performing evaporation coating at a specific angle according to the included angle to achieve electrical connections of the plurality of cathodes 80 to the sidewalls 60b of the protruding portions 60P at the broken positions.

Referring to FIG. 2E, an embodiment of the present invention provides a display 100 including a thin film transistor substrate 10 including a plurality of thin film transistors 11; a planarization layer 20 disposed on the thin film transistor substrate 10; a plurality of anodes 30 and a plurality of auxiliary source traces 40 disposed on the planarization layer 20, wherein the plurality of anodes 30 are electrically connected to the plurality of thin film transistors through the planarization layer 20; a pixel definition layer 50 disposed on the plurality of anodes 30, the plurality of auxiliary source traces 40, and the planarization layer 20 not covered by the plurality of anodes 30 and the plurality of auxiliary source traces 40, wherein the pixel definition layer 50 has a plurality of first openings 51 respectively corresponding to and exposing the plurality of auxiliary source traces 40, and the pixel definition layer 50 has a plurality of second openings 52 respectively corresponding to and exposing the plurality of anodes 30; a plurality of electrical conductors 60 filled in the plurality of first openings 51 and on a portion of the pixel definition layer 50 around the plurality of first openings 51, wherein the plurality of electrical conductors 60 have a plurality of protruding portions 60P higher than the pixel definition layer 50; an electroluminescent layer 70 covering an upper surface 60a of the electrical conductor and a sidewall and a bottom of the plurality of second openings 52; and a plurality of cathodes 80 covering the electroluminescent layer 70 and electrically connected to sidewalls 60b of the plurality of electrical conductors 60 respectively.

As shown in FIG. 2E, in an embodiment of the invention, the electroluminescent layer 70 further covers the pixel defining layer 50 around the plurality of second openings 52.

As shown in FIG. 2E, in an embodiment of the invention, the plurality of electrical conductors 60 are preferably higher than the upper surfaces of the plurality of cathodes 80. The plurality of electrical conductors 60 of the display 100 provided by the present invention are preferably higher than or equal to the plurality of cathodes 80. However, the embodiment where the cathodes 80 are higher than the electrical conductors 60 is not excluded from the invention.

Figure 3:
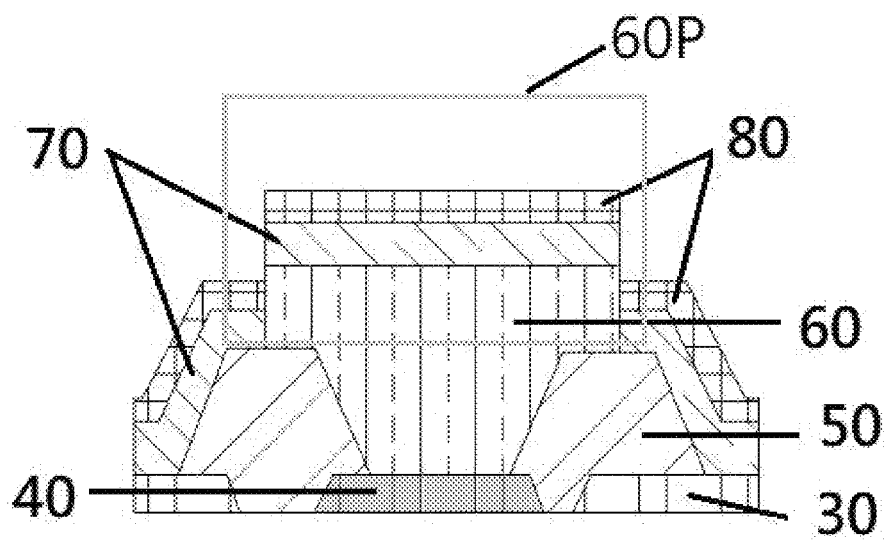
FIG. 3 is a schematic view showing a structure of an electrical conductor of a display according to an embodiment of the invention.
Figure 4:
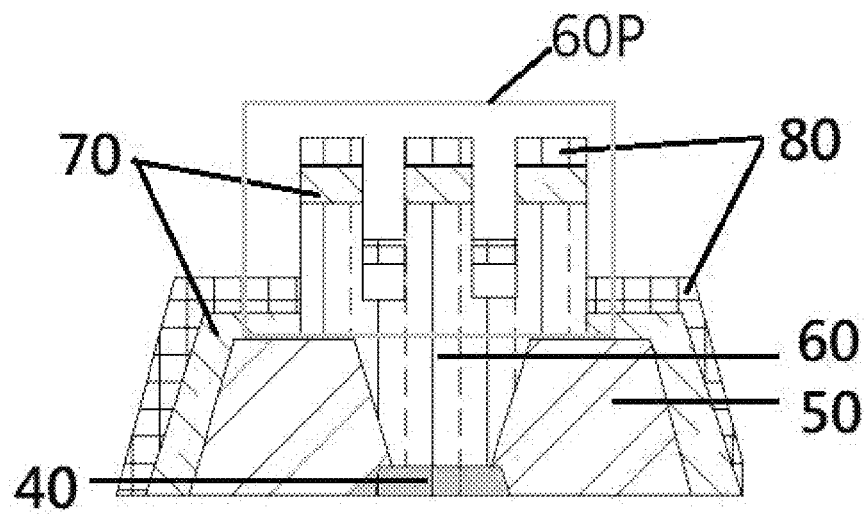
FIG. 4 is a schematic view showing a structure of an electrical conductor of a display according to another embodiment of the present invention.
Figure 5:
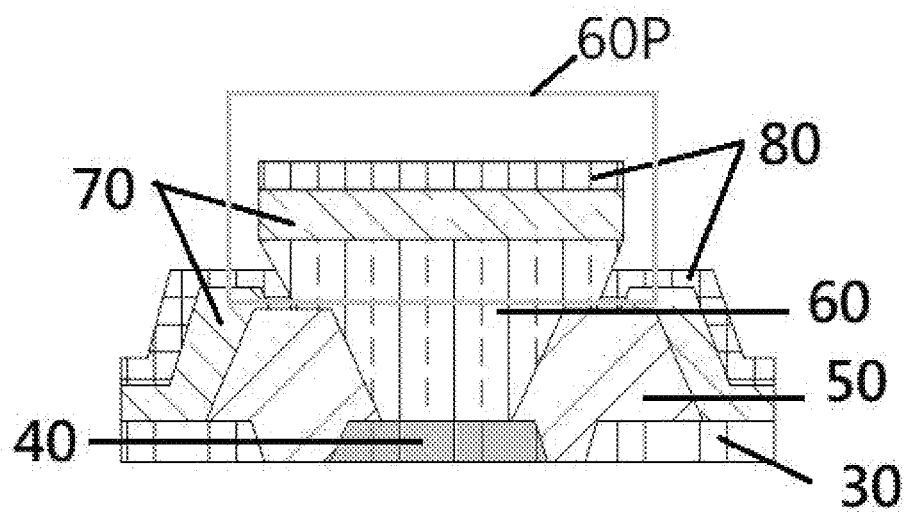
FIG. 5 is a schematic view showing a structure of an electrical conductor of a display according to still another embodiment of the present invention.

Referring to FIGS. 3 to 5, in an embodiment of the present invention, each of the plurality of protruding portions 60P has a rectangular shape (as shown in FIG. 3), an irregular shape (as shown in FIG. 4), an inverted trapezoidal shape (as shown in FIG. 5), or an irregular shape wide at top and narrow at bottom (not shown). As such, in an embodiment of the invention, an included angle between a sidewall of each of the plurality of protruding portions 60P and an upper surface of the pixel definition layer 50 is less than or equal to 90 degrees.

Specifically, in an embodiment of the invention, the sidewalls of the plurality of protruding portions 60P are flat or irregularly shaped surfaces. In other embodiments of the present invention, in order to maximize the connection area of the cathode 80 and the electrical conductors 60, shapes of the conductors 60 may be designed into various irregular shapes, and edges of the sidewalls 60b of the electrical conductors 60 may be made to be a regular or irregular curve to increase a conduction path.

In an embodiment of the invention, the plurality of electrical conductors include a metallic or organic electrically conductive material, and the electroluminescent layer 70 includes an organic material. The electroluminescent layer 70 is configured to emit white light.

In an embodiment of the invention, the thin film transistor substrate 10 can be any transistor, such as a low temperature poly-silicon (LTPS), an oxide thin film transistor, or a solid phase crystallization poly-Si (SPC) thin film transistor, which does not need to be specifically limited herein.

Accordingly, the present invention provides a display that utilizes a design of an auxiliary electrode of an organic light-emitting diode (OLED) panel made by large-scale evaporation coating or printing, wherein by changing the backboard design, during the anode process, the auxiliary source trace is prepared in advance such that the trace is located at a bottom of a pixel definition layer (PDL). During the PDL layer process, an opening is formed along a lengthwise direction of a sub-pixel, and electrical conductors having protruding portions are formed to connect with auxiliary source traces. A distance of the electrical conductors having the protruding portions higher than the PDL is determined according to thicknesses of an electroluminescence (EL) layer and a cathode, and sidewalls of the electrical conductors having the protruding portions are designed to be steep, so that material of the electroluminescent layer is naturally broken between a top and a bottom of the electrical conductors. As such, the cathode material can be evaporated at the broken positions to achieve electrical connections to the sidewalls of the electrical conductors. Since the electrical conductors along a long axis of the sub-pixel is large, connection areas of the cathodes and the electrical conductors become two-dimensional, and are greatly enlarged, thereby improving the poor performance of a conventional point connection to auxiliary electrode. In addition, the auxiliary electrode design proposed by the present invention occupies no extra space, that is, the problem of IP drop of the active-matrix organic light-emitting diode (AMOLED) panel is solved while increasing the design space of the light-emitting area during illuminating the top backboard.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display, comprising:
a thin film transistor substrate comprising a plurality of thin film transistors;
a planarization layer disposed on the thin film transistor substrate;
a plurality of anodes and a plurality of auxiliary source traces disposed on the planarization layer, wherein the plurality of anodes are electrically connected to the plurality of thin film transistors through the planarization layer;
a pixel definition layer disposed on the plurality of anodes, the plurality of auxiliary source traces, and the planarization layer not covered by the plurality of anodes and the plurality of auxiliary source traces, wherein the pixel definition layer has a plurality of first openings respectively corresponding to and exposing the plurality of auxiliary source traces, and the pixel definition layer has a plurality of second openings respectively corresponding to and exposing the plurality of anodes;
a plurality of electrical conductors filled in the plurality of first openings and on a portion of the pixel definition layer around the plurality of first openings, wherein the plurality of electrical conductors have a plurality of protruding portions higher than the pixel definition layer;
an electroluminescent layer covering an upper surface of the electrical conductors and a sidewall and a bottom of the plurality of second openings; and
a plurality of cathodes covering the electroluminescent layer and electrically connected to sidewalls of the plurality of electrical conductors respectively,
wherein an included angle between a sidewall of each of the plurality of protruding portions and an upper surface of the pixel definition layer is less than or equal to 90 degrees, and each of the plurality of protruding portions has a rectangular shape, an inverted trapezoidal shape, or an irregular shape wide at top and narrow at bottom.

2. The display according to claim 1, wherein the plurality of electrical conductors comprise a metallic or organic electrically conductive material, and the electroluminescent layer comprises an organic material.

3. The display according to claim 1, wherein the plurality of electrical conductors are higher than upper surfaces of the plurality of cathodes.

4. A display, comprising:
a thin film transistor substrate comprising a plurality of thin film transistors;
a planarization layer disposed on the thin film transistor substrate;
a plurality of anodes and a plurality of auxiliary source traces disposed on the planarization layer, wherein the plurality of anodes are electrically connected to the plurality of thin film transistors through the planarization layer;
a pixel definition layer disposed on the plurality of anodes, the plurality of auxiliary source traces, and the planarization layer not covered by the plurality of anodes and the plurality of auxiliary source traces, wherein the pixel definition layer has a plurality of first openings respectively corresponding to and exposing the plurality of auxiliary source traces, and the pixel definition layer has a plurality of second openings respectively corresponding to and exposing the plurality of anodes;
a plurality of electrical conductors filled in the plurality of first openings and on a portion of the pixel definition layer around the plurality of first openings, wherein the plurality of electrical conductors have a plurality of protruding portions higher than the pixel definition layer;
an electroluminescent layer covering an upper surface of the electrical conductor and a sidewall and a bottom of the plurality of second openings; and
a plurality of cathodes covering the electroluminescent layer and electrically connected to sidewalls of the plurality of electrical conductors respectively.

5. The display according to claim 4, wherein the plurality of electrical conductors comprise a metallic or organic electrically conductive material and the electroluminescent layer comprises an organic material.

6. The display according to claim 4, wherein the plurality of electrical conductors are higher than an upper surface of said plurality of cathodes.

7. The display according to claim 4, wherein an included angle between a sidewall of each of the plurality of protruding portions and an upper surface of the pixel definition layer is less than or equal to 90 degrees.

8. The display according to claim 4, wherein each of the plurality of protruding portions has a rectangular shape, an inverted trapezoidal shape, or an irregular shape wide at top and narrow at bottom.

9. The display according to claim 4, wherein the electroluminescent layer is configured to emit white light.

10. A method of preparing a display, comprising:
S10, providing a thin film transistor substrate, wherein the thin film transistor substrate comprises a plurality of thin film transistors;
S20, forming a planarization layer on the thin film transistor substrate;
S30, forming a plurality of anodes and a plurality of auxiliary source traces on a portion of the planarization layer, wherein the plurality of anodes are electrically connected to the plurality of thin film transistors through the planarization layer;
S40, forming a pixel definition layer on the plurality of anodes, the plurality of auxiliary source traces, and the planarization layer not covered by the plurality of anodes and the plurality of auxiliary source traces, wherein the pixel definition layer has a plurality of first openings respectively corresponding to and exposing the plurality of auxiliary source traces, and the pixel definition layer has a plurality of second openings respectively corresponding to and exposing the plurality of anodes;
S50, forming a plurality of electrical conductors filled in the plurality of first openings and on a portion of the pixel definition layer around the plurality of first openings, wherein the plurality of electrical conductors have a plurality of protruding portions higher than the pixel definition layer;
S60, forming an electroluminescent layer on an upper surface of the electrical conductor and a sidewall and a bottom of the plurality of second openings; and
S70, forming a plurality of cathodes on the electroluminescent layer and electrically connected to sidewalls of the plurality of electrical conductors respectively.

11. The method of preparing a display according to claim 10, wherein in the step S60, forming the electroluminescent layer comprises evaporation coating, and material of the electroluminescent layer is naturally broken at sidewalls of the protruding portions to form broken positions which expose the sidewalls of the protruding portions.

12. The method of preparing a display according to claim 11, wherein an included angle between a sidewall of each of the plurality of protruding portions and an upper surface of the pixel definition layer is less than or equal to 90 degrees, and each of the plurality of protruding portions has a rectangular shape, an inverted trapezoidal shape, or an irregular shape wide at top and narrow at bottom.

13. The method of preparing a display according to claim 11, wherein in the step S70, forming the plurality of cathodes comprises: performing evaporation coating at a specific angle according to the included angle to achieve electrical connections of the plurality of cathodes to the sidewalls of the protruding portions at the broken positions.

* * * * *